(12) United States Patent
Zheng

(10) Patent No.: US 9,640,757 B2
(45) Date of Patent: May 2, 2017

(54) DOUBLE SELF-ALIGNED PHASE CHANGE MEMORY DEVICE STRUCTURE

(71) Applicant: ENTEGRIS, INC., Billerica, MA (US)

(72) Inventor: Jun-Fei Zheng, Westport, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 14/437,189

(22) PCT Filed: Oct. 28, 2013

(86) PCT No.: PCT/US2013/067145
§ 371 (c)(1),
(2) Date: Apr. 20, 2015

(87) PCT Pub. No.: WO2014/070682
PCT Pub. Date: May 8, 2014

(65) Prior Publication Data
US 2015/0280115 A1     Oct. 1, 2015

Related U.S. Application Data

(60) Provisional application No. 61/720,283, filed on Oct. 30, 2012.

(51) Int. Cl.
*H01L 45/00*     (2006.01)

(52) U.S. Cl.
CPC ............ *H01L 45/06* (2013.01); *H01L 45/124* (2013.01); *H01L 45/141* (2013.01); *H01L 45/144* (2013.01); *H01L 45/16* (2013.01)

(58) Field of Classification Search
CPC ..... H01L 45/06; H01L 45/124; H01L 45/144; H01L 45/16; H01L 45/141; H01L 45/04; H01L 45/142; H01L 45/143
See application file for complete search history.

(56) References Cited

U.S. PATENT DOCUMENTS

| 3,467,686 A | 9/1969 | Creamer |
| 4,383,119 A | 5/1983 | Pullukat et al. |

(Continued)

FOREIGN PATENT DOCUMENTS

| EP | 1466918 A1 | 10/2004 |
| EP | 1675194 A2 | 6/2006 |

(Continued)

OTHER PUBLICATIONS

Bochmann, M. et al., "Synthesis of Some Alkyl Metal Selenolato Complexes of Zinc, Cadmium and Mercury, X-Ray Crystal Structure of Me, Hg, Se(2,4,6-Pr13C6H2)", "Polyhedron", 1992, pp. 507-512, vol. 11, No. 5.

(Continued)

*Primary Examiner* — Galina Yushina
(74) *Attorney, Agent, or Firm* — Entegris, Inc. Legal Dept.; Nidhi G. Kissoon; John E. Pillion

(57) ABSTRACT

A double self-aligned phase change memory device structure, comprising spaced-apart facing phase change memory film members symmetrically arranged with respect to one another, each of the phase change memory film members at an upper portion thereof being in contact with a separate conductive element, and each of the phase change memory film members being in a range of from 5 nm to 25 nm in thickness. Also described are various methods of making such phase change memory device structure.

20 Claims, 7 Drawing Sheets

(56) References Cited

U.S. PATENT DOCUMENTS

| | | |
|---|---|---|
| 4,491,669 A | 1/1985 | Arkles et al. |
| 4,499,198 A | 2/1985 | Pullukat et al. |
| 4,895,709 A | 1/1990 | Laine |
| 4,927,670 A | 5/1990 | Erbil |
| 4,948,623 A | 8/1990 | Beach et al. |
| 4,960,916 A | 10/1990 | Pazik |
| 4,962,214 A | 10/1990 | Villacorta et al. |
| 5,003,092 A | 3/1991 | Beachley, Jr. |
| 5,008,422 A | 4/1991 | Blum et al. |
| 5,084,588 A | 1/1992 | Ocheltree et al. |
| 5,139,825 A | 8/1992 | Gordon et al. |
| 5,178,911 A | 1/1993 | Gordon et al. |
| 5,210,254 A | 5/1993 | Ritscher et al. |
| 5,225,561 A | 7/1993 | Kirlin et al. |
| 5,268,496 A | 12/1993 | Geisberger |
| 5,312,983 A | 5/1994 | Brown et al. |
| 5,417,823 A | 5/1995 | Narula et al. |
| 5,442,200 A | 8/1995 | Tischler |
| 5,453,494 A | 9/1995 | Kirlin et al. |
| 5,566,045 A | 10/1996 | Summerfelt et al. |
| 5,576,928 A | 11/1996 | Summerfelt et al. |
| 5,583,205 A | 12/1996 | Rees, Jr. |
| 5,596,522 A | 1/1997 | Ovshinsky et al. |
| 5,653,806 A | 8/1997 | Van Buskirk |
| 5,687,112 A | 11/1997 | Ovshinsky |
| 5,698,726 A | 12/1997 | Rauleder et al. |
| 5,719,417 A | 2/1998 | Roeder et al. |
| 5,726,294 A | 3/1998 | Rees, Jr. |
| 5,820,664 A | 10/1998 | Gardiner et al. |
| 5,919,522 A | 7/1999 | Baum et al. |
| 5,976,991 A | 11/1999 | Laxman et al. |
| 5,980,265 A | 11/1999 | Tischler |
| 5,998,236 A | 12/1999 | Roeder et al. |
| 6,005,127 A | 12/1999 | Todd et al. |
| 6,015,917 A | 1/2000 | Bhandari et al. |
| 6,086,779 A | 7/2000 | Bishop et al. |
| 6,133,051 A | 10/2000 | Hintermaier et al. |
| 6,146,608 A | 11/2000 | Todd et al. |
| 6,269,979 B1 | 8/2001 | Dumont |
| 6,281,022 B1 | 8/2001 | Li et al. |
| 6,319,565 B1 | 11/2001 | Todd et al. |
| 6,399,208 B1 | 6/2002 | Baum et al. |
| 6,506,666 B2 | 1/2003 | Marsh |
| 6,511,718 B1 | 1/2003 | Paz de Araujo et al. |
| 6,646,122 B1 | 11/2003 | Nuhlen et al. |
| 6,716,271 B1 | 4/2004 | Arno et al. |
| 6,750,079 B2 | 6/2004 | Lowrey et al. |
| 6,767,830 B2 | 7/2004 | Wang et al. |
| 6,787,186 B1 | 9/2004 | Hintermaier |
| 6,861,559 B2 | 3/2005 | Odom |
| 6,869,638 B2 | 3/2005 | Baum et al. |
| 6,872,963 B2 | 3/2005 | Kostylev et al. |
| 6,908,812 B2 | 6/2005 | Lowrey |
| 6,916,944 B2 | 7/2005 | Furukawa et al. |
| 6,984,591 B1 | 1/2006 | Buchanan et al. |
| 6,998,289 B2 | 2/2006 | Hudgens et al. |
| 7,005,303 B2 | 2/2006 | Hintermaier et al. |
| 7,029,978 B2 | 4/2006 | Dodge |
| 7,087,482 B2 | 8/2006 | Yeo et al. |
| 7,114,517 B2 | 10/2006 | Sund et al. |
| 7,115,927 B2 | 10/2006 | Hideki et al. |
| 7,312,165 B2 | 12/2007 | Jursich et al. |
| 7,332,735 B2 | 2/2008 | Campbell |
| 7,371,429 B2 | 5/2008 | Lee et al. |
| 7,397,060 B2 | 7/2008 | Lung |
| 7,399,666 B2 | 7/2008 | Ahn et al. |
| 7,402,851 B2 | 7/2008 | Hideki et al. |
| 7,419,698 B2 | 9/2008 | Jones |
| 7,425,735 B2 | 9/2008 | Park et al. |
| 7,439,536 B2 | 10/2008 | Pellizzer et al. |
| 7,462,900 B2 | 12/2008 | Hideki et al. |
| 7,473,921 B2 | 1/2009 | Lam et al. |
| 7,476,917 B2 | 1/2009 | Hideki et al. |
| 7,488,967 B2 | 2/2009 | Burr et al. |
| 7,525,117 B2 | 4/2009 | Kostylev et al. |
| 7,569,417 B2 | 8/2009 | Lee et al. |
| 7,615,401 B2 | 11/2009 | Park et al. |
| 7,615,439 B1 | 11/2009 | Schricker et al. |
| 7,632,456 B2 | 12/2009 | Cheong et al. |
| 7,704,787 B2 | 4/2010 | Hideki et al. |
| 7,728,172 B2 | 6/2010 | Lee et al. |
| 7,732,801 B2 | 6/2010 | Chen |
| 7,791,932 B2 | 9/2010 | Kuh et al. |
| 7,838,329 B2 | 11/2010 | Hunks et al. |
| 7,851,253 B2 | 12/2010 | Chen |
| 7,935,564 B2 | 5/2011 | Breitwisch et al. |
| 7,935,594 B2 | 5/2011 | Schricker et al. |
| 7,943,502 B2 | 5/2011 | Park et al. |
| 7,943,923 B2 | 5/2011 | Gidon |
| 7,969,011 B2 | 6/2011 | Sekar et al. |
| 7,989,795 B2 | 8/2011 | Chen et al. |
| 7,989,796 B2 | 8/2011 | Lam et al. |
| 8,008,117 B2 | 8/2011 | Hunks et al. |
| 8,192,592 B2 | 6/2012 | Kim et al. |
| 8,272,347 B2 | 9/2012 | Nasman et al. |
| 8,330,136 B2 | 12/2012 | Zheng et al. |
| 8,410,468 B2 | 4/2013 | Zheng |
| 8,445,354 B2 | 5/2013 | Ha et al. |
| 8,617,972 B2 | 12/2013 | Zheng |
| 9,012,876 B2 | 4/2015 | Zheng |
| 9,070,875 B2 | 6/2015 | Zheng |
| 2002/0004266 A1 | 1/2002 | Hashimoto et al. |
| 2002/0090815 A1 | 7/2002 | Koike et al. |
| 2003/0073295 A1 | 4/2003 | Xu |
| 2003/0135061 A1 | 7/2003 | Norman et al. |
| 2004/0012009 A1 | 1/2004 | Casagrande et al. |
| 2004/0038808 A1 | 2/2004 | Hampden-Smith et al. |
| 2004/0087074 A1 | 5/2004 | Hwang et al. |
| 2004/0197945 A1 | 10/2004 | Woelk et al. |
| 2004/0215030 A1 | 10/2004 | Norman |
| 2005/0029502 A1 | 2/2005 | Hudgens |
| 2005/0064334 A1 | 3/2005 | Hirotsune et al. |
| 2005/0082624 A1 | 4/2005 | Gousev et al. |
| 2005/0208699 A1 | 9/2005 | Furkay et al. |
| 2005/0267345 A1 | 12/2005 | Korgel et al. |
| 2005/0283012 A1 | 12/2005 | Xu et al. |
| 2005/0287747 A1 | 12/2005 | Chakravarti et al. |
| 2006/0006449 A1 | 1/2006 | Jeong et al. |
| 2006/0024429 A1 | 2/2006 | Horii |
| 2006/0027451 A1 | 2/2006 | Park et al. |
| 2006/0035462 A1 | 2/2006 | Millward |
| 2006/0040485 A1 | 2/2006 | Lee et al. |
| 2006/0046521 A1 | 3/2006 | Vaartstra et al. |
| 2006/0049447 A1 | 3/2006 | Lee et al. |
| 2006/0054878 A1 | 3/2006 | Lowrey |
| 2006/0105556 A1 | 5/2006 | Matsui et al. |
| 2006/0113520 A1 | 6/2006 | Yamamoto et al. |
| 2006/0115595 A1 | 6/2006 | Shenai-Khatkhate et al. |
| 2006/0138393 A1 | 6/2006 | Seo et al. |
| 2006/0141155 A1 | 6/2006 | Gordon et al. |
| 2006/0141710 A1 | 6/2006 | Yoon et al. |
| 2006/0172067 A1 | 8/2006 | Ovshinsky et al. |
| 2006/0172083 A1 | 8/2006 | Lee et al. |
| 2006/0180811 A1 | 8/2006 | Lee et al. |
| 2006/0249369 A1 | 11/2006 | Marangon et al. |
| 2007/0025226 A1 | 2/2007 | Park et al. |
| 2007/0090336 A1 | 4/2007 | Asano et al. |
| 2007/0120104 A1 | 5/2007 | Ahn et al. |
| 2007/0121363 A1 | 5/2007 | Lung |
| 2007/0152205 A1* | 7/2007 | Chen ................. H01L 27/2463 257/4 |
| 2007/0154637 A1 | 7/2007 | Shenai-Khatkhate et al. |
| 2007/0160760 A1 | 7/2007 | Shin et al. |
| 2007/0246748 A1 | 10/2007 | Breitwisch et al. |
| 2007/0252127 A1 | 11/2007 | Arnold et al. |
| 2007/0272950 A1 | 11/2007 | Kim et al. |
| 2008/0003359 A1 | 1/2008 | Gordon et al. |
| 2008/0017841 A1 | 1/2008 | Lee et al. |
| 2008/0035906 A1 | 2/2008 | Park et al. |
| 2008/0035961 A1 | 2/2008 | Chen et al. |
| 2008/0067490 A1 | 3/2008 | Hayakawa |
| 2008/0078984 A1 | 4/2008 | Park et al. |
| 2008/0096386 A1 | 4/2008 | Park et al. |
| 2008/0099791 A1 | 5/2008 | Lung et al. |

(56) References Cited

U.S. PATENT DOCUMENTS

| | | |
|---|---|---|
| 2008/0118636 A1 | 5/2008 | Shin et al. |
| 2008/0164453 A1 | 7/2008 | Breitwisch et al. |
| 2008/0169457 A1 | 7/2008 | Hideki et al. |
| 2008/0191187 A1 | 8/2008 | Lung et al. |
| 2008/0210163 A1 | 9/2008 | Carlson et al. |
| 2008/0254218 A1 | 10/2008 | Lei et al. |
| 2008/0254232 A1 | 10/2008 | Gordon et al. |
| 2008/0258127 A1 | 10/2008 | Lee et al. |
| 2008/0265236 A1 | 10/2008 | Lee et al. |
| 2008/0272355 A1 | 11/2008 | Cho et al. |
| 2008/0290335 A1 | 11/2008 | Lin et al. |
| 2009/0020738 A1 | 1/2009 | Happ et al. |
| 2009/0057643 A1* | 3/2009 | Chen .................. G11C 11/5678 257/4 |
| 2009/0065761 A1* | 3/2009 | Chen .................. H01L 23/5256 257/5 |
| 2009/0075420 A1 | 3/2009 | Bae et al. |
| 2009/0087561 A1 | 4/2009 | Chen et al. |
| 2009/0097305 A1 | 4/2009 | Bae et al. |
| 2009/0101883 A1 | 4/2009 | Lai et al. |
| 2009/0112009 A1 | 4/2009 | Chen et al. |
| 2009/0124039 A1 | 5/2009 | Roeder et al. |
| 2009/0184309 A1 | 7/2009 | Mathew et al. |
| 2009/0215225 A1 | 8/2009 | Stender et al. |
| 2009/0227066 A1 | 9/2009 | Joseph et al. |
| 2009/0242865 A1* | 10/2009 | Lung ...................... H01L 27/24 257/2 |
| 2009/0250682 A1 | 10/2009 | Park et al. |
| 2009/0275164 A1 | 11/2009 | Chen et al. |
| 2009/0291208 A1 | 11/2009 | Gordon et al. |
| 2009/0298223 A1 | 12/2009 | Cheek et al. |
| 2009/0302297 A1 | 12/2009 | Park et al. |
| 2009/0305458 A1 | 12/2009 | Hunks et al. |
| 2009/0321706 A1* | 12/2009 | Happ .................. G11C 13/0004 257/4 |
| 2009/0321733 A1 | 12/2009 | Gatineau et al. |
| 2010/0012917 A1 | 1/2010 | Takaura et al. |
| 2010/0018439 A1 | 1/2010 | Cameron et al. |
| 2010/0054029 A1 | 3/2010 | Happ et al. |
| 2010/0059731 A1 | 3/2010 | Chang |
| 2010/0081263 A1 | 4/2010 | Horii et al. |
| 2010/0096610 A1 | 4/2010 | Wang et al. |
| 2010/0112211 A1 | 5/2010 | Xu et al. |
| 2010/0112795 A1 | 5/2010 | Kaim et al. |
| 2010/0116990 A1 | 5/2010 | Xu et al. |
| 2010/0130013 A1 | 5/2010 | Liu et al. |
| 2010/0164057 A1 | 7/2010 | Hunks et al. |
| 2010/0190341 A1 | 7/2010 | Park et al. |
| 2010/0209610 A1 | 8/2010 | Cameron et al. |
| 2010/0243981 A1 | 9/2010 | Kang et al. |
| 2010/0264396 A1 | 10/2010 | Lung et al. |
| 2010/0270527 A1 | 10/2010 | Sawamura |
| 2010/0270529 A1 | 10/2010 | Lung |
| 2010/0317150 A1 | 12/2010 | Hunks et al. |
| 2011/0001107 A1 | 1/2011 | Zheng |
| 2011/0006279 A1 | 1/2011 | Chen |
| 2011/0060165 A1 | 3/2011 | Cameron et al. |
| 2011/0065252 A1 | 3/2011 | Nakamura |
| 2011/0111556 A1 | 5/2011 | Chen et al. |
| 2011/0124182 A1 | 5/2011 | Zheng |
| 2011/0136316 A1 | 6/2011 | Chang |
| 2011/0155989 A1* | 6/2011 | Park .......................... H01L 45/06 257/3 |
| 2011/0198555 A1 | 8/2011 | Kikuchi et al. |
| 2011/0212568 A1 | 9/2011 | Shin |
| 2011/0227021 A1 | 9/2011 | Schrott et al. |
| 2011/0227029 A1 | 9/2011 | Liu |
| 2011/0260132 A1 | 10/2011 | Zheng et al. |
| 2011/0260290 A1* | 10/2011 | Kalra ..................... B82Y 10/00 257/538 |
| 2011/0263100 A1 | 10/2011 | Hunks et al. |
| 2012/0032135 A1 | 2/2012 | Kuh et al. |
| 2012/0115315 A1 | 5/2012 | Zheng et al. |
| 2012/0134204 A1 | 5/2012 | Happ et al. |
| 2012/0171812 A1 | 7/2012 | Marsh |
| 2013/0078475 A1 | 3/2013 | Zheng |
| 2013/0112933 A1 | 5/2013 | Zheng |
| 2013/0241037 A1 | 9/2013 | Jeong et al. |
| 2013/0284999 A1 | 10/2013 | Zheng |

FOREIGN PATENT DOCUMENTS

| | | |
|---|---|---|
| EP | 1806427 A2 | 7/2007 |
| EP | 1710807 B1 | 11/2008 |
| JP | 58-38296 A | 3/1983 |
| JP | 5-311423 A | 11/1993 |
| JP | 6-80413 A | 3/1994 |
| JP | 6-293778 A | 10/1994 |
| JP | 7-263431 A | 10/1995 |
| JP | 8-74055 A | 3/1996 |
| JP | 2000-215510 A | 8/2000 |
| JP | 2001-67720 A | 3/2001 |
| JP | 2002-211924 A | 7/2002 |
| JP | 2002-220658 A | 8/2002 |
| JP | 2006-511716 A | 4/2006 |
| JP | 2006-124262 A | 5/2006 |
| JP | 2006-182781 A | 7/2006 |
| JP | 2008-252088 A | 10/2008 |
| JP | 2011-66135 A | 3/2011 |
| KR | 10-2004-0076225 A | 8/2004 |
| KR | 10-2005-0048891 A | 5/2005 |
| KR | 10-2006-0001089 A | 1/2006 |
| KR | 10-0585175 B1 | 5/2006 |
| KR | 10-2006-0091160 A | 8/2006 |
| KR | 10-2007-0025612 A | 3/2007 |
| KR | 10-0695168 B1 | 3/2007 |
| KR | 10-2007-0105752 A | 10/2007 |
| KR | 10-2008-0052362 A | 6/2008 |
| KR | 10-2008-0080273 A | 9/2008 |
| KR | 10-2009-0008799 A | 1/2009 |
| KR | 10-2009-0029488 A | 3/2009 |
| KR | 10-2009-0036771 A | 4/2009 |
| KR | 10-2009-0045132 A | 5/2009 |
| KR | 10-2011-0076394 A | 7/2011 |
| KR | 10-1067969 B1 | 9/2011 |
| SU | 768457 A | 10/1980 |
| TW | 200625543 A | 7/2006 |
| TW | 200822356 A | 5/2008 |
| WO | 0015865 A1 | 3/2000 |
| WO | 0067300 A1 | 11/2000 |
| WO | 2004046417 A2 | 6/2004 |
| WO | 2004076712 A1 | 9/2004 |
| WO | 2005084231 A2 | 9/2005 |
| WO | 2006012052 A2 | 2/2006 |
| WO | 2007070218 A2 | 6/2007 |
| WO | 2007126690 A2 | 11/2007 |
| WO | 2007140813 A1 | 12/2007 |
| WO | 2008002546 A1 | 1/2008 |
| WO | 2008057616 A2 | 5/2008 |
| WO | 2009006272 A1 | 1/2009 |
| WO | 2009020888 A1 | 2/2009 |
| WO | 2009034775 A1 | 3/2009 |
| WO | 2009059237 A2 | 5/2009 |
| WO | 2011002705 A2 | 1/2011 |
| WO | 2011146913 A2 | 11/2011 |

OTHER PUBLICATIONS

Bradley, D., et al., "Metallo-organic compounds containing metal-nitrogen bonds. Part I. Some dialkylamino-derivatives of titanium and Zirconium", "Journal of the Chemical Society", Oct. 1960, pp. 3857-3861.

Bradley, D., et al., "Metallo-organic compounds containing metal-nitrogen bonds: Part III. Dialkylamino compounds of tantalum", "Canadian Journal of Chemistry", Jul. 1962, pp. 1355-1360, vol. 40, No. 7.

Bwembya, G., et al., "Phosphinochalcogenoic Amidato Complexes of Zinc and Cadmium as Novel Single-Source Precursors for the Deposition of Metal Selenide and Telluride Films", "Chemical Vapor Deposition", 1995, pp. 78-80, vol. 1, No. 3.

(56) References Cited

OTHER PUBLICATIONS

Carmalt, C., et al., "Synthesis of titanium(IV) guanidinate complexes and the formation of titanium carbonitride via low-pressure chemical vapor deposition", "Inorganic Chemistry", Jan. 7, 2005, pp. 615-619, vol. 44, No. 3.

Chen, T., et al., "Low temperature Deposition of Ge Thin Films with a Ge(II) Silylamido Source", "ECS Transactions", 2007, pp. 269-278, vol. 11, No. 7.

Cheng, H., et al., "Wet Etching of Ge2Sb2Te5 Films and Switching Properties of Resultant Phase Change Memory Cells", "Semiconductor Science and Technology", Sep. 26, 2005, pp. 1111-1115, vol. 20, No. 11.

Chiu, H., et al., "Deposition of tantalum nitride thin films from ethylimidotantalum complex", "Journal of Materials Science Letters", Jan. 1992, pp. 96-98, vol. 11, No. 2.

Cho, K., et al., "Designing PbSe Nanowires and Nanorings through Oriented Attachment of Nanoparticles", "J. Am. Chem. Soc.", Apr. 23, 2005, pp. 7140-7147, vol. 127.

Choi, B.,et al., "Combined Atomic Layer and Chemical Vapor Deposition, and Selective Growth of Ge2Sb2Te5 Films on TiN/W Contact Plug", "Chem. Mater.", Aug. 14, 2007, pp. 4387-4389, vol. 19.

Choi, B., et al., "Cyclic PECVD of Ge2Sb2Te5 Films Using Metallorganic Sources", "Journal of the Electrochemical Society", Feb. 22, 2007, pp. H318-H324, vol. 154, No. 4.

Chorley, R., et al., "Subvalent Group 14 metal compounds XIV. The X-ray crystal structures of two monomeric Group 14 metal bisamides, Ge[N(SiMe3)2]2 and Sn[NC(Me)2(CH2)3CMe2]2", "Inorganica Chimica Acta", Aug.-Oct. 1992, pp. 203-209, vol. 198-200.

Cole-Hamilton, D., "MOVPE Mechanisms from studies of specially designed and labelled precursors", "Chem. Commun.", 1999, pp. 759-765.

Cummins, C., et al., "Synthesis of Terminal Vanadium(V) Imido, Oxo, Sulfido, Selenido, and Tellurido Complexes by Imido Group or or Chalcogen Atom Transfer to Trigonal Monopyramidal V[N3N] (N3N=[(Me3SiNCH2CH2)3N]3-", "Inorganic Chemistry", Mar. 30, 1994, pp. 1448-1457, vol. 33, No. 7.

Drake, J., et al., "Studies of Silyl and Germyl Group 6 Species. 5. Silyl and Germyl Derivatives of Methane- and Benzenetellurols", "Inorg. Chem.", 1980, pp. 1879-1883, vol. 19.

Foley, S., et al., "Facile Formation of Rare Terminal Chalcogenido Germanium Complexes with Alkylamidinates as Supporting Ligands", "J. Am. Chem. Soc.", Oct. 29, 1997, pp. 10359-10363, vol. 119, No. 43.

Foley, S., et al., "Synthesis and structural characterization of the first trialylguanidinate and hexahydropyramidinate complexes of tin", "Polyhedron", 2002, pp. 619-627, vol. 21.

Gehrhus, B., et al., "New Reactions of a Silylene: Insertion into M—N Bonds of M[N(SiMe3)2]2 (M=Ge, Sn, or Pb)", "Angew. Chem. Int. Ed. Engl.", 1997, pp. 2514-2516, vol. 36, No. 22.

Gordon, R., et al., "Silicon dimethylamido complexes and ammonia as precursors for the atmospheric pressure chemical vapor deposition of Silicon Nitride thin films", "Chem. Mater.", Sep. 1990, pp. 480-482, vol. 2, No. 5.

Note: For the non-patent literature citations that no month of publication is indicated, the year of publication is more than 1 year prior to the effective filing date of the present application.

Green, S., et al., "Synthetic, structural and theoretical studies of amidinate and guanidinate stabilised germanium(I) dimers", "Chem. Commun.", Sep. 8, 2006, pp. 3978-3980.

Green, S., et al., "Complexes of an Anionic Gallium(I) N-Heterocyclic Carbene Analogue with Group 14 Element(II) Fragments: Synthetic, Structural and Theoretical Studies", "Inorganic Chem.", Aug. 3, 2006, pp. 7242-7251, vol. 45, No. 18.

Gumrukcu, I., et al., "Electron Spin Resonance of t-Alkyl-, Silyl-, and Germyl-aminyl Radicals and some Observations on the Amides MBr{N(SiMe3)2}3 (M=Ge,Sn, or Pb)", "J.C.S. Chem. Comm.", 1980, pp. 776-777.

Gupta, A., et al., "Triorganoantimony(V) complexes with internally functionallized oximes: synthetic, spectroscopic and structural aspects of [R3Sb(Br)L], [R3Sb(OH)L] and [R3SbL2], crystal and molecular structures of [Me3Sb{ON=C(Me)C4H3O}2], [Me3Sb{ON=C(Me)C4H3S}2] 2-OC4H3C(Me)=NOH and 2-SC4H3C(Me)=NOH", "Journal of Organometallic Chemistry", 2002, pp. 118-126, vol. 645.

Gynane, M., et al., "Subvalent Group 4B Metal Alkyls and Amides. Part 5. The Synthesis and Physical Properties of Thermally Stable Amides of Germanium(II), Tin(II), and Lead(II)", "J. Chem. Soc., Dalton Transactions", 1977, pp. 2004-2009.

Han, L., et al., "Extremely Facile Oxidative Addition of Silyl, Germyl, and Stannyl Tellurides and Other Chalcogenides to Platinum(0) Complexes, X-ray Structure of trans-Pt(4-PhC6H4Te)(SiMe3)(PEt3)2", "J. Am. Chem. Soc.", 1997, pp. 8133-8134, vol. 119.

Harris, D., et al., "Monomeric, Volatile Bivalent Amides of Group IVB Elements, M(NR12)2 and M(NR1R2)2 (M=Ge, Sn, or Pb; R1=Me3Si, R2=Me3C)", "J.C.S. Chem. Comm.", 1974, pp. 895-896.

Hatanpaa, T., et al., "Synthesis and characterisation of cyclopentadienyl complexes of barium: precursors for atomic layer deposition of BaTiO3", "Dalton Trans.", Mar. 22, 2004, pp. 1181-1188, vol. 8.

Herrmann, W., et al., "Stable Cyclic Germanediyls ('Cyclogermylenes'): Synthesis, Structure, Metal Complexes, and Thermolyses", "Angew. Chem. Int. Ed. Engl.", 1992, pp. 1485-1488, vol. 31, No. 11.

Herrmann, W., et al., "Volatile Metal Alkoxides according to the Concept of Donor Functionalization", "Angew. Chem. Int. Ed. Engl.", 1995, pp. 2187-2206, vol. 34.

Hitchcock, P., et al., "Subvalent Group 14 Metal Compounds-XIII. Oxidative Addition Reactions of Germanium and Tin Amides M(NR2)2 (R=SiMe3, M=Ge or Sn) With Sulphur, Selenium, Tellurium or MeOOCC==CCOOMe; X-Ray Structures of [Ge(NR2)2(mu-Te)]2 and Sn(NR2)2CC(OMe)OSn(NR2)2CC(OMe)O", "Polyhedron", 1991, pp. 1203-1213, vol. 10, No. 117.

Hitchcock, P., et al., "Synthesis and Structures of Bis[bis(trimethylsilyl)amido]-tin(iv) Cyclic Chalcogenides [{Sn[ N (Si Me3)2]2(mu-E)}2] and a Heterobimetallic Analogue [{(Me3Si)2N}2Ge(mu-Te)2Sn—{N(SiMe3)2}2] (E=S, Se or Te)", "J. Chem Soc. Dalton Trans.", 1995, pp. 3179-3187.

Hor, Y., et al., "Superconducting NbSe2 nanowires and nanoribbons converted from NbSe3 nanostructures", "Applied Physics Letters", Sep. 27, 2005, pp. 1-3, vol. 87, No. 142506.

Horii, H., et al., "A Novel Cell Technology Using N-Doped GeSbTe Films for Phase Change RAM", "Symposium on VLSI Technology Digest of Technical Papers", Jun. 10-12, 2003, pp. 177-178.

Hudgens, S., et al., "Overview of Phase Change Chalcogenide Nonvolatile Memory Technology", "MRS Bulletin", Nov. 2004, pp. 1-5.

George, T., et al., "Amino-derivatives of Metals and Metalloids. Part II. Amino-stannylation of Unsaturated Substrates, and the Infrared Spectra and Structures of Carbamato- and Dithiocarbamato-trimethylstannanes and Related Compounds", "J. Chemical Society", 1965, pp. 2157-2165, No. 385.

Just, O., et al., "Synthesis and Single-Crystal X-ray Diffraction Examination of a Structurally Homologous Series of TetracoordinateHeteroleptic Anionic Lanthanide Complexes: Ln{N[Si(CH3)2CH2CH2Si(CH3)2]}3(I—Cl)Li(L)3 [Ln=Sm, Eu, Gd, Tb, Dy, Ho, Er, Tm, Yb; (L)3=(THF)3, (Et2O)3, (THF)2(Et2O)]", "Inorg. Chem.", Mar. 9, 2001, pp. 1751-1755, vol. 40, No. 8.

Kapoor, P., et al., "High surface area homogeneous nanocrystalline bimetallic oxides obtained by hydrolysis of bimetallic mu-oxo alkoxides", "J. Mater. Chem.", Jan. 14, 2003, pp. 410-414, vol. 13.

Karsch, H., et al., "Bis(amidinate) Complexes of Silicon and Germanium", "Eur. J. Inorg. Chemistry", Apr. 1998, pp. 433-436, vol. 4.

(56) References Cited

OTHER PUBLICATIONS

Kim, R., et al., "Structural properties of Ge2Sb2Te5 thin films by metal organic chemical vapor deposition for phase change memory applications", "Applied Physics Letters", Sep. 6, 2006, pp. 102107-1-102107-3, vol. 89.

Ritch, J., et al., "The single molecular precursor approach to metal telluride thin films: imino-bis (diisopropylphosphine tellurides) as examples", "Chem. Soc. Rev.", Jun. 27, 2007, pp. 1622-1631, vol. 36.

Kim, S., et al., "Electrical Properties and Crystal Structures of Nitrogen-Doped Ge2Sb2Te5 Thin Film for Phase Change Memory", "Thin Solid Films", Dec. 22, 2004, pp. 322-326, vol. 469-470.

Kuchta, M., et al., "Multiple Bonding Between Germanium and the Chalcogens: The Syntheses and Structures of the Terminal Chalogenido Complexes (n4-Me8taa)GeE (E=S, Se, Te)", "J. Chem. Soc. Chem. Commun.", 1994, pp. 1351-1352.

Kuchta, M., et al., "Comparison of the reactivity of germanium and tin terminal chalcogenido complexes: the syntheses of chalcogenolate and dichalcogenidostannacyclopentane derivatives", "Chem. Commun.", 1996, pp. 1669-1670.

Kuehl, O., "N-heterocyclic germylenes and related compounds", "Coordination Chemistry Reviews", 2004, pp. 411-427, vol. 248.

Lappert, M., et al., "Monomeric Bivalent Group 4B Metal Dialkylamides M[NCMe2(CH2)3CMe2] (M=Ge or Sn), and the Structure of a Gaseous Disilylamide, Sn[N(SiMe3)2]2, by Gas Electron Diffraction", "J.C.S. Chem. Comm.", 1979, pp. 369-370, vol. 8.

Lappert, M., et al., "Monomeric, Coloured Germanium(II) and Tin(II) Di-t-Butylamides, and the Crystal and Molecular Structure of Ge(NCMe2[CH2]3CMe2)2", "J.C.S. Chem. Comm.", 1980, pp. 621-622, vol. 13.

Lee, J., et al., "GeSbTe deposition for the PRAM application", "Applied Surface Science", Feb. 2007, pp. 3969-3976, vol. 253, No. 8.

Leskela, M., et al., "Atomic layer deposition chemistry: recent developments and future challenges", "Angew. Chem. Int. Ed.", Nov. 24, 2003, pp. 5548-5554, vol. 42, No. 45.

Macomber, D., et al., "(n5-Cyclopentadienyl)- and (n5-Pentamethylcyclopentadienyl)copper Compounds Containing Phosphine, Carbonyl, and n2-Acetylenic Ligands", "J. Am. Chem. Soc.", 1983, pp. 5325-5329, vol. 105.

Maruyama, T., et al., "Silicon dioxide thin films prepared by chemical vapor deposition from tetrakis(diethylamino) silane and ozone", "Appl. Phys. Letters", May 23, 1994, pp. 2800-2802, vol. 64, No. 21.

Maruyama, T., "Electrical Characterization of Silicon Dioxide Thin Films Prepared by Chemical Vapor Deposition from Tetrakis(diethylamino)silane and Ozone", "Jpn. J. Appl. Phys.", Jul. 15, 1997, pp. L922-L925, vol. 36, Part 2, No. 7B.

Mathur, S., et al., "Germanium Nanowires and Core-Shell Nanostructures by Chemical Vapor Deposition of [Ge(C5H5)2]", "Chem. Mater.", May 15, 2004, pp. 2449-2456, vol. 16, No. 12.

Matsuda, I., et al., "Reactions of Group IV Organometallic Compounds: XXVIII. The Insertion Reactions of Benzoyl-Tert-Butylcarbodiimide With Group IV Trimethylmetallylamines and the Perparation of Trimethyl-Silyl- and -Germyl-tert-Butyl-Carbodiimide", "Journal of Organometallic Chemistry", 1974, pp. 353-359, vol. 69.

Meller, A., et al., "Synthesis and Isolation of New Germanium(II) Compounds and of Free Germylenes", "Chem. Ber.", May 1985, pp. 2020-2029 (English Abstract), vol. 118, No. 5.

Metzler, N., et al., "Synthesis of a silylene-borane adduct and its slow conversion to a silylborane", "Chem. Commun.", 1996, pp. 2657-2658.

Neumann, W., "Germylenes and Stannylenes", "Chem. Rev.", 1991, pp. 311-334, vol. 91, Publisher: American Chemical Society.

Oakley, S., et al., "Structural consequences of the prohibition of hydrogen bonding in copper-guanidine systems", "Inorg. Chem.", Jul. 13, 2004, pp. 5168-5172, vol. 43, No. 16 (Abstract).

O'Brien, P., et al., "Single-molecule Precursor Chemistry for the Deposition of Chalcogenide(S or Se)-containing Compound Semiconductors by MOCVD and Related Methods", "J. Mater. Chem.", 1995, pp. 1761-1773, vol. 5, No. 11.

Ovshinsky, S., "Reversible Electrical Switching Phenomena in Disordered Structures", "Physical Review Letters", Nov. 11, 1968, pp. 1450-1455, vol. 21, No. 20.

Pickett, N., et al., "Gas-phase formation of zinc/cadmium chalcogenide cluster complexes and their solid-state thermal decomposition to form II-VI nanoparticulate material", "J. Mater. Chem.", 1998, pp. 2769-2776, vol. 8.

Privitera, S., et al., "Phase change mechanisms in Ge2Sb2Te5", "Journal of Applied Physics", Jul. 9, 2007, pp. 1-5, vol. 102, No. 013516.

Raj, P., et al., "Synthesis and characterization of the complex triorganoantimony (V) cations, R3SbL'2+ and R3Sb(L-L)2+", "Synthesis and Reactivity in Inorganic and Metal-Organic Chemistry", 1992, pp. 543-557 (Abstract), vol. 22, No. 5.

Raj, P., et al., "Synthesis and geometry of complex triorganoantimony(V) cations", "Synthesis and Reactivity in Inorganic and Metal-Organic Chemistry", 1992, pp. 1471-1494 (Abstract), vol. 22, No. 10.

Raoux, S., et al., "Influence of Dopants on the Crystallization Temperature, Crystal Structure, Resistance, and Threshold Field for Ge2Sb2Te5 and GeTe Phase Change Materials", "European/Phase Change and Ovonics Symposium", Sep. 4-6, 2011, pp. 1-8, Published in: Zuerich, Switzerland.

Raoux, S., et al., "Materials Engineering for Phase Change Random Access Memory", "11th Annual Non-Volatile Memory Technology Symposium (NVMTS)", Nov. 7-9, 2011, pp. 1-5.

Ren, H., et al., "Synthesis and structures of cyclopentadienyl N-heterocyclic carbene copper(I) complexes", "Journal of Organometallic Chemistry", Jun. 21, 2006, pp. 4109-4113, vol. 691.

Richardson, M., et al., "Volatile rare earth chelates of 1,1,1,5,5,5-hexafluoro-2,4-pentanedione and 1,1,1,2,2,3,3,7,7,7-decafluoro-4,6-heptanedione", "Inorganic Chemistry", 1971, pp. 498-504, vol. 10, No. 3.

Note: For the non-patent literature citations that no month of publication is indicated, the year of publication is more than 1 year prior to the effective date of the present application.

Schlecht, S., et al., "Direct Synthesis of (PhSe)4Ge and (PhTe)4Ge from Activated Hydrogenated Germanium—Crystal Structure and Twinning of (PhTe)4Ge", "Eur. J. Inorg. Chem.", 2003, pp. 1411-1415.

Shenai, D., et al., "Safer alternative liquid germanium precursors for relaxed graded SiGe layers and strained silicon by MOVPE", "Journal of Crystal Growth", Jan. 8, 2007, pp. 172-175, vol. 298.

Shi, Y., et al., "Titanium dipyrrolylmethane derivatives: rapid intermolecular alkyne hydroamination", "Chem. Commun.", Mar. 7, 2003, pp. 586-587, No. 5.

Stauf, G., et al., "Low Temperature ALD of Germanium for Phase Change Memory Thin Films", "AVS 7th International Conference on Atomic Layer Deposition—ALD 2007", Jun. 24, 2007, pp. 1-8.

Steigerwald, M., et al., "Organometallic Synthesis of II-VI Semiconductors. 1. Formation and Decomposition of Bis(organotelluro)mercury and Bis(organotelluro)cadmium Compounds", "J. Am. Chem. Soc.", 1987, pp. 7200-7201, vol. 109.

Sun, S., et al., "Performance of MOCVD tantalum nitride diffusion barrier for copper metallization", "1995 Symposium on VLSI Technology Digest of Technical Papers", Jun. 1995, pp. 29-30.

Tsai, M., et al., "Metalorganic chemical vapor deposition of tantalum nitride by tertbutylimidotris(diethylamido) tantalum for advanced metallization", "Appl. Phys. Lett.", Aug. 21, 1995, pp. 1128-1130, vol. 67, No. 8.

Tsai, M., et al., "Metal-organic chemical vapor deposition of tantalum nitride barrier layers for ULSI applications", "Thin Solid Films", Dec. 1, 1995, pp. 531-536, vol. 270, No. 1-2.

Tsumuraya, T., et al., "Telluradigermiranes. A Novel Three-membered Ring System Containing Tellurium", "J. Chem. Soc. Chem. Commun.", 1990, pp. 1159-1160.

(56) References Cited

OTHER PUBLICATIONS

Vehkamaki, M., et al., "Atomic Layer Deposition of SrTiO3 Thin Films from a Novel Strontium Precursor-Strontium-bis(tri-isopropylcyclopentadienyl)", "Chemical Vapor Deposition", Mar. 2001, pp. 75-80, vol. 7, No. 2.

Veith, M., et al., "Additionsreaktionen an intramolekular basenstabilisierte Ge=N- und Ge=S-Doppelbindungen", "Chem. Ber.", 1991, pp. 1135-1141 (English Abstract), vol. 124.

Veith, M., et al., "New perspectives in the tailoring of hetero (bi and tri-) metallic alkoxide derivatives", "Polyhedron", 1998, pp. 1005-1034, vol. 17, No. 5-6.

Veith, M., et al., "Molecular precursors for (nano) materials—a one step strategy", "J. Chem. Soc. Dalton. Trans.", May 20, 2002, pp. 2405-2412.

Veprek, S., et al., "Organometallic chemical vapor deposition of germanium from a cyclic germylene, 1,3-Di-tert-butyl-1,3,2-diazagermolidin-2-ylidine", "Chem. Mater.", 1996, pp. 825-831, vol. 8.

Weller, H., "Colloidal Semiconductor Q-Particles: Chemistry in the Transition Region Between Solid State and Molecules", "Angew. Chem. Int. Ed. Engl.", 1993, pp. 41-53, vol. 32.

Weller, H., "Self-organized Superlattices of Nanoparticles", "Angew. Chem. Int. Ed. Engl.", 1996, pp. 1079-1081, vol. 35, No. 10.

Sasamori, T., et al., "Reactions of a Germacyclopropabenzene with Elemental Chalcogens: Syntheses and Structures of a Series of Stable 2H-Benzo[c][1,2]chalcogenagermetes", "Organometallics", Jan. 14, 2005, pp. 612-618, vol. 24.

Abrutis, A., et al., "Hot-Wire Chemical Vapor Deposition of Chalcogenide Materials for Phase Change Memory Applications", "Chem. Mater.", May 2008, pp. 3557-3559, vol. 20, No. 11.

Allen, F., et al., "Tables of Bond Lengths Determined by X-ray and Neutron Diffraction. Part 1. Bond Lengths in Organic Compounds", "J. Chem. Soc. Perkin Tran. II", 1987, pp. S1-S19.

Anderson, H., "Dialkylaminogermanes and Dialkylaminosilanes", "J. Amer. Chem. Soc.", Mar. 20, 1952, pp. 1421-1423, vol. 74, No. 6.

Anderson, Q., et al., "Synthesis and Characterization of the First Pentaphenylcyclopentadienyl Copper(I) Complex, (Ph5Cp)Cu(PPh3)", "Organometallics", 1998, pp. 4917-4920, vol. 17.

Artaud-Gillet, M., et al., "Evaluation of copper organometallic sources for CuGaSe2 photovoltaic applications", "Journal of Crystal Growth", 2003, pp. 163-168, vol. 248.

Auner, N., et al., "Organosilicon Chemistry IV: From Molecules to Materials", Mar. 2000, p. 291 (Abstract), Publisher: Wiley-Vch.

Baines, K., et al., "A Facile Digermene-to-germylgermylene Rearrangement; Bulky Germylene Insertion into the Si—H Bond", "J. Chem. Soc. Chem. Commun.", 1992, pp. 1484-1485.

Baxter, D., et al., "Low Pressure Chemical Vapor Deposition of Metallic Films of Iron, Manganese, Cobalt, Copper, Germanium and Tin Employing Bis(trimethyl)silylamido Complexes, M(N(SiMe3)2)n", "Chemical Vapor Deposition", 1995, pp. 49-51, vol. 1, No. 2.

Behrens, S., et al., "Synthesis and Structure of the Nanoclusters [Hg32Se14(SePh)36], [Cd32Se14(SePh) 36"(PPh3)4], [P(Et)2(Ph)C4H8OSiMe3]5[Cd18I17(PSiMe3)12]", "Angew. Chem. Int. Ed. Engl.", 1996, pp. 2215-2218, vol. 35, No. 19.

\* cited by examiner

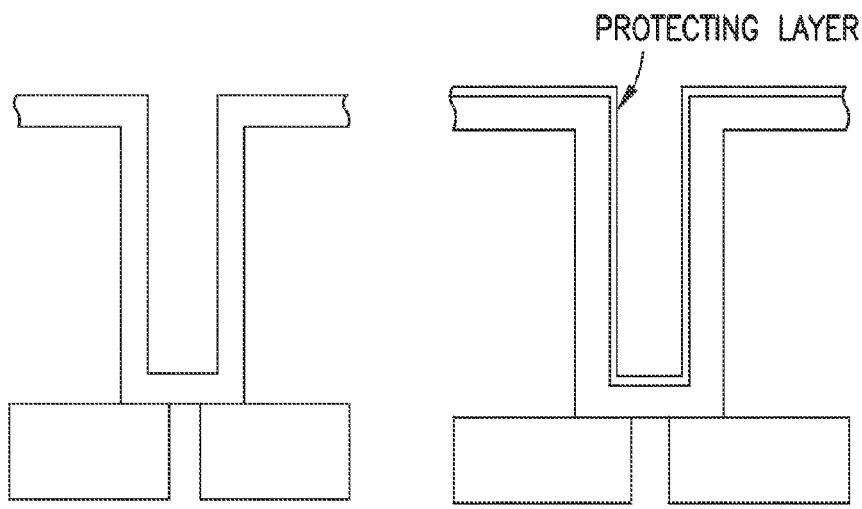
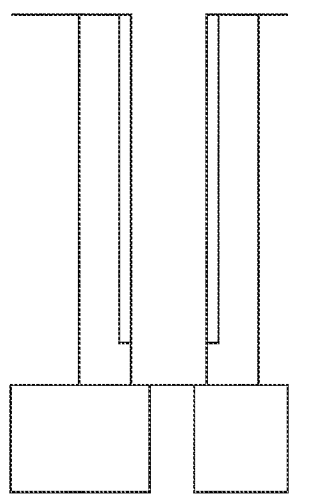 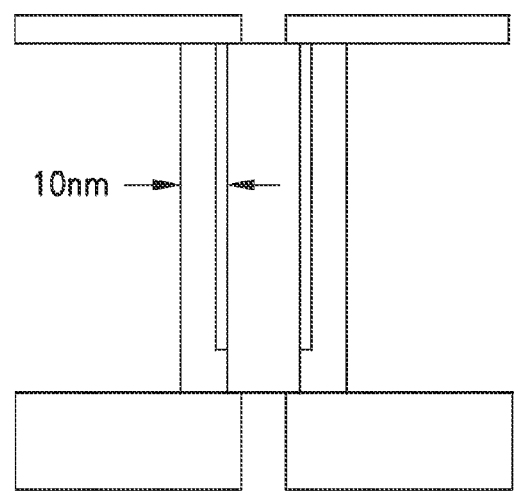
FIG. 1  FIG. 2
FIG. 3  FIG. 4

(a) SELF-ALIGNED "WALL"
STORAGE ELEMENT
CONTACT AREA 450nm2

(b) "DASH" BOARD CELL STRUCTURE
CONTACT AREA 200nm2

(c) "CROSS-SPACER STRUCTURE
CONTACT AREA 100nm2

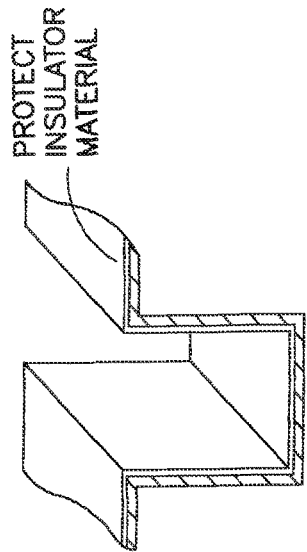
SiO₂ TRENCH
FIG. 10
DEPOSIT TiN ~10nm
FIG. 11
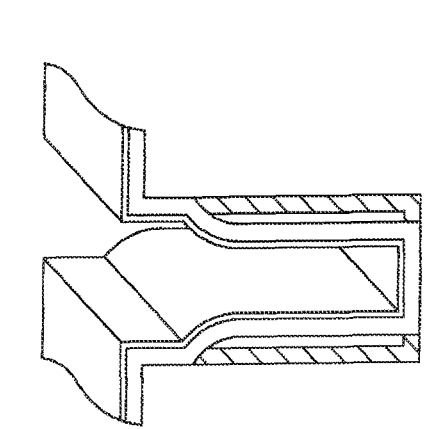
DEPOSIT PROTECT LAYER OVER TiN
PROTECT LAYER IS INSULATOR
FIG. 12
ANISOTROPIC ETCH WITH OVER-ETCH
FIG. 13
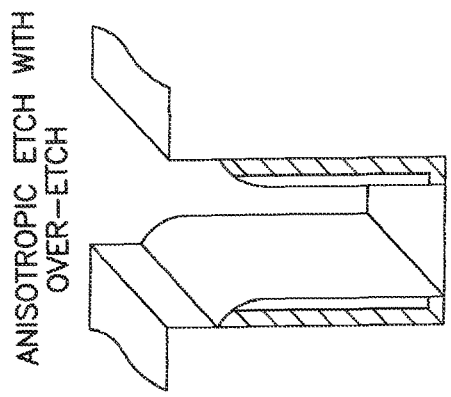
FIG. 14
FIG. 15

DOUBLE SELF-ALIGNED PHASE CHANGE MEMORY DEVICE STRUCTURE

CROSS-REFERENCE TO RELATED APPLICATIONS

This application is a U.S. national phase under the provisions of 35 U.S.C. §371 of International Patent Application No. PCT/US13/67145 filed Oct. 28, 2013, which in turn claims the benefit of priority under 35 USC 119 of U.S. Provisional Patent Application No. 61/720,283 filed Oct. 30, 2012 in the name of Jun-Fei Zheng for DOUBLE SELF-ALIGNED PHASE CHANGE MEMORY DEVICE STRUCTURE. The disclosures of such International Patent Application No. PCT/US 13/67,145 and U.S. Provisional Patent Application No. 61/720,283 are hereby incorporated herein by reference, in their respective entireties, for all purposes.

FIELD

The present disclosure relates to double self-aligned phase change memory device structures and methods of making the same.

DESCRIPTION OF THE RELATED ART

Phase change memory (PCM) is a type of non-volatile computer memory that utilizes differences in the electrical resistivity of the crystalline and amorphous phase states of memory materials. Devices that incorporate PCM typically comprise substrates on which a particular memory material (e.g., a chalcogenide) is deposited.

The memory material is characteristically deposited within structures (such as holes, trenches, or the like) in or on the surfaces of the substrate. Patterned electrodes are also deposited on the substrate to allow for the conduction of current. The conduction of current is effected through the deposited memory material, with the level of current being dependent on the resistivity and heating efficiency of such memory material and its alloy properties on phase change.

Memory materials used in the manufacture of PCM devices include germanium antimony telluride (GST) and germanium-telluride (GeTe). The GST materials can function in principle very effectively as phase change material for a volume, v, having characteristic dimensions as small as 5 nm. The trend is to make PCM devices based on GST with characteristic dimensions in the regime of 30 to 10 nm or less in future generations of devices.

To confine the heat for phase change, PCM material-containing structures may be fabricated with surrounding or otherwise associated dielectric material, and the structure may embody aspect ratios or dimensional characteristics that facilitate heating efficiency. The deposition of the phase change memory material can be carried out by vapor deposition processes, e.g., chemical vapor deposition (CVD) or atomic layer deposition (ALD), to produce films of useful character for phase change memory applications inside a cavity, e.g., a hole or trench in a substrate.

In addition to the deposition of phase change memory materials into existing substrate surface structures such as cavities, e.g., holes or trenches, phase change memory device structures can also be fabricated as confined cell equivalent structures by initially forming the phase change memory material, and then surrounding the phase change memory material with dielectric material. The phase change memory material in such applications may be in a very small cell structure having correspondingly small top and bottom contact areas, e.g., areas on the order of 5-10 nm×50-100 nm (thickness of contact metal x width of contact metal) permitted by current lithography capability, with the phase change memory material extended at a height of 30 nm or more. In such cell structures, the phase change memory material is surrounded by thermally and electrically insulating materials.

SUMMARY

The present disclosure relates to double self-aligned phase change memory device structures and methods of making the same.

In one aspect, the disclosure relates to a double self-aligned phase change memory device structure, comprising spaced-apart facing phase change memory film members symmetrically arranged with respect to one another, each of the phase change memory film members at an upper portion thereof being in contact with a separate conductive element, and each of the phase change memory film members being in a range of from 5 nm to 25 nm in thickness.

In another aspect, the disclosure relates to a method of forming a memory device structure of the disclosure, comprising the process flow illustrated in FIGS. 1-4 herein.

In a further aspect, the disclosure relates to a method of forming a memory device structure of the disclosure, comprising the process flow illustrated in FIGS. 10-23 herein.

Other aspects, features and embodiments of the disclosure will be more fully apparent from the ensuing description and appended claims.

BRIEF DESCRIPTION OF THE DRAWINGS

FIGS. 1-4 show a process flow for fabricating a phase change memory device sidewall line cell structure.

FIGS. 10-23 illustrate a schematic process flow for forming a double self-aligned phase change memory device structure.

DETAILED DESCRIPTION

Figure 5:
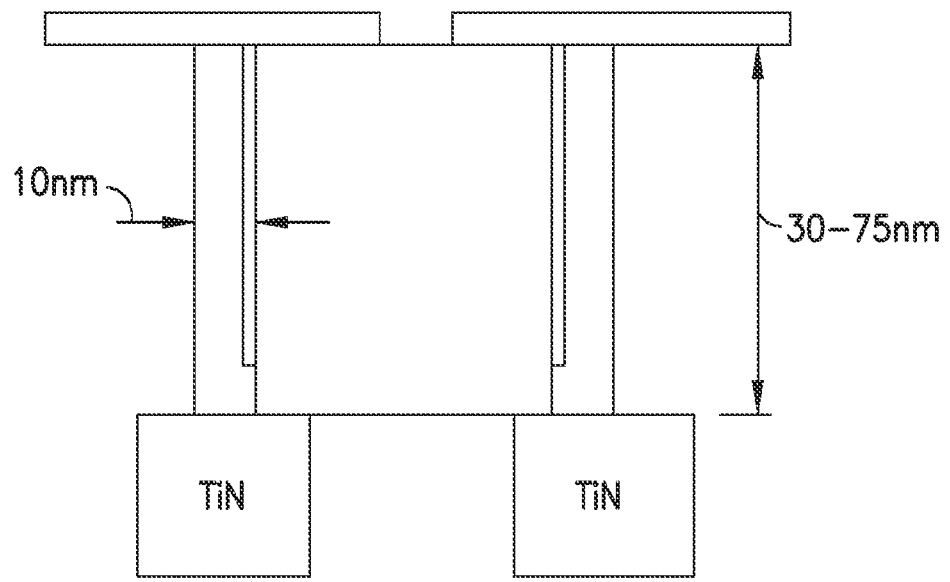
FIG. 5 is a front elevation view of a phase change memory device cell structure, as fabricated by a process flow sequence as shown in FIGS. 1-4.

The present disclosure relates to double self-aligned phase change memory device structures and methods of making the same.

In one aspect, the disclosure relates to a double self-aligned phase change memory device structure, comprising spaced-apart facing phase change memory film members symmetrically arranged with respect to one another, each of the phase change memory film members at an upper portion thereof being in contact with a separate conductive element, and each of the phase change memory film members being in a range of from 5 nm to 25 nm in thickness.

Such memory device structure may be fabricated with a protecting layer disposed on facing surfaces of said phase change memory film members. The protecting layer may extend downwardly from an upper end of each phase change memory film member over the facing surface thereof to a lower portion of the phase change memory film member. In various embodiments, the structure may be fabricated, with a dielectric material between the protecting layers of the phase change memory film members.

In the memory device structure, each of the phase change memory film members may be of any suitable thickness, e.g., a thickness in a range of from 8 to 20 nm, a thickness in a range of from 10 to 15 nm, a thickness in a range of from 5 to 15 nm, or any other suitable thickness effective for performance of the memory device structure in a phase change memory implementation.

In various embodiments, each phase change memory film member may have a height appropriate to the phase change memory implementation of the structure, e.g., in a range of from 20 to 80 nm, in a range of from 30 to 75 nm, or any other suitable range of height values.

The phase change memory material itself may comprise any suitable material, e.g., a chalcogenide, such as a germanium-antimony-tellurium alloy, or a germanium telluride alloy.

In some embodiments of the memory device structure of the disclosure, the phase change memory material film members may be arranged in a confined cell arrangement comprising a cross-spacer structure wherein the phase change memory material film members are positioned transversely to and reposed on titanium nitride members. In such cross-spacer structure, the contact area of each phase change memory film member and the titanium nitride member on which it is reposed may be in a range of for example from 50 to 150 nm$^2$, a range of from 80 to 120 nm$^2$, or any other suitable contact area range.

The memory device structure of the disclosure may include arrangements in which each phase change memory material film member comprises an upper planar segment, an intermediate angular transition segment, and a lower planar segment, arranged so that the upper planar segment and lower planar segment of each phase change memory material film member are generally parallel to one another and to respective upper planar and lower planar segments of the other phase change memory material film member facing it, wherein transverse spacing distance between upper planar segments of the respective phase change memory material film members is greater than transverse spacing distance between lower planar segments of the respective phase change memory film members. In such structural arrangements, the intermediate angular transition segment may be of a generally planar character, or may be in a curvate or other non-planar conformation.

In other embodiments of the every device structure of the present disclosure, each phase change memory material film member may comprise an upper planar segment and a lower planar segment, elevationally spaced apart from one another, and arranged so that the upper planar segment and lower planar segment of each phase change memory material film member are generally parallel to one another and to respective upper planar and lower planar segments of the other phase change memory material film member facing it, wherein transverse spacing distance between upper planar segments of the respective phase change memory material film members is greater than transverse spacing distance between lower planar segments of the respective phase change memory film members.

The present disclosure further contemplates various methods of forming memory device structures of the disclosure, as hereinafter more fully described, and including the process flow illustrated in FIGS. 1-4 herein, as well as the process flow illustrated in FIGS. 10-23 herein.

The features, aspects, and advantages of the double self-aligned phase change memory device structures of the present disclosure, and methods of making the same, are more fully illustrated with respect to the ensuing description of FIGS. 1-26.

FIGS. 1-4 show a process flow for fabricating a phase change memory device sidewall line cell structure.

FIG. 1 illustrates a trench in a substrate on which a phase change material, e.g., an alloy such as germanium-antimony-tellurium (GST) or germanium telluride (GeTe) is conformally deposited by a vapor deposition process, e.g., MOCVD process, to form a phase change memory material film on wall surface of the trench. Such conformal deposition yields a central open core region in the interior volume of the trench that is bounded by the phase change memory material film on wall surface of the trench.

FIG. 2 shows the structure of FIG. 1 in which a conformal protecting layer of suitable material is deposited over the phase change memory material film. Next, a vertical anisotropic spacer etch is carried out, yielding the structure shown in FIG. 3. Thereafter, the gap in the central open core of the structure is filled with suitable material, e.g., dielectric material, followed by chemical mechanical planarization, and formation of the top electrode members, yielding the structure as shown in FIG. 4, in which the vertically extending phase change memory film members have a thickness of 10 nm.

FIG. 5 is a front elevation view of a phase change memory device cell structure, as fabricated by a process flow sequence as shown in FIGS. 1-4. The vertically extending phase change memory film member has a thickness of 10 nm, and the height of the phase change memory film may be in a range of from 30 to 75 nm, as illustrated.

Figure 6:
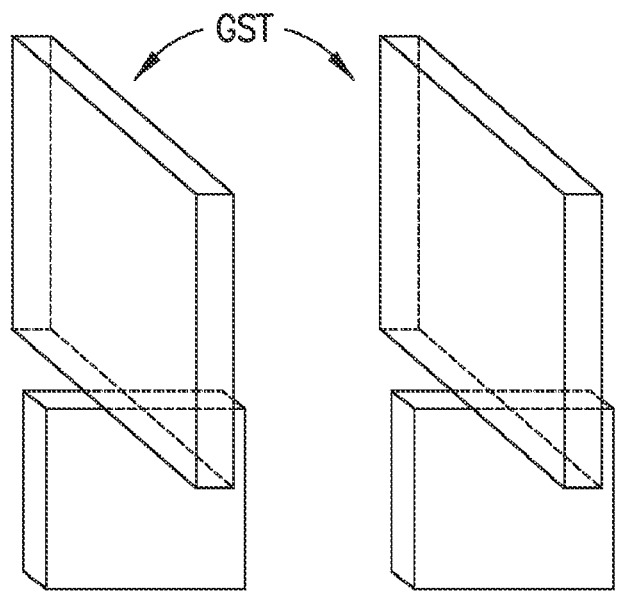
FIG. 6 is a perspective view of the phase change memory device cell structure.

FIG. 6 is a perspective view of the phase change memory device cell structure, showing two GST members in a cross-spacer structure on respective TiN members.

Figure 7:
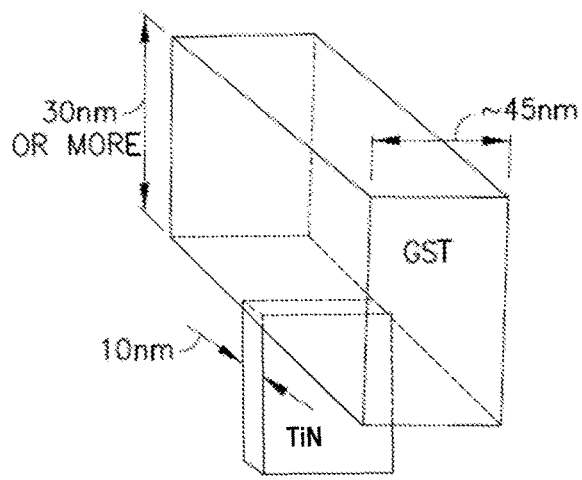
FIGS. 7-9 show perspective schematic views of different cell structures and their respective contact areas.
Figure 8:
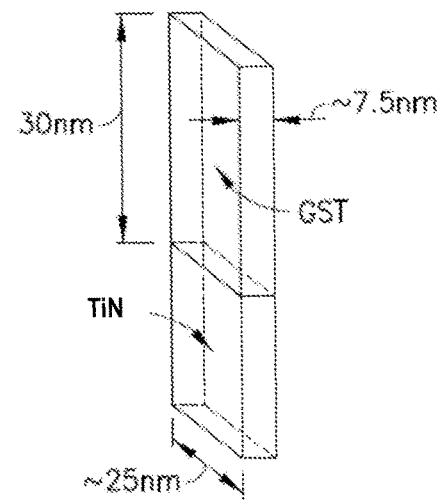
Figure 9:
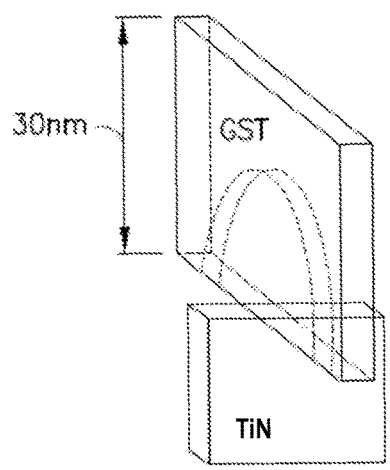

FIGS. 7-9 show perspective schematic views of different cell structures and their respective contact areas.

FIG. 7 shows a self-aligned wall storage arrangement including a GST member having a transverse dimension of about 45 nm and a height of 30 nm or more, reposed on a TiN member having a corresponding transverse dimension of about 45 nm and a thickness of 10 nm. The contact area of the GST member with the TiN member in such arrangement is 450 nm$^2$, and the arrangement exhibits a reset current of approximately 0.2 mA.

FIG. 8 shows a dashboard cell structure in which the GST member has a height of 30 nm and a thickness of approximately 7.5 nm. Each of the GST member and the TiN member has a width dimension on the order of 25 nm. The contact area of the GST member with the TiN member in such arrangement is approximately 200 nm$^2$, and the arrangement exhibits a reset current of approximately 0.08 mA.

FIG. 9 shows a cross-spacer structure in which the GST member has a height of 30 nm, and is positioned transversely to the TiN member. The contact area of the GST member with the TiN member in such arrangement is approximately 100 nm².

FIGS. 10-23 illustrate a schematic process flow for forming a double self-aligned phase change memory device structure.

FIG. 10 is a perspective view of a trench structure in a SiO₂ substrate. As shown in FIG. 11, a TiN film is deposited on the trench structure, e.g., at a thickness on the order of 10 nm. FIG. 12 shows a protective insulating material being deposited over the TiN film. An anisotropic etch with over-etching is next carried out, to form the structure shown in FIG. 13. Conformal deposition of GST is thereafter carried out, to form the structure shown in FIG. 14. A protective insulating layer then is deposited on the GST, to form the structure shown in FIG. 15.

Figure 16:
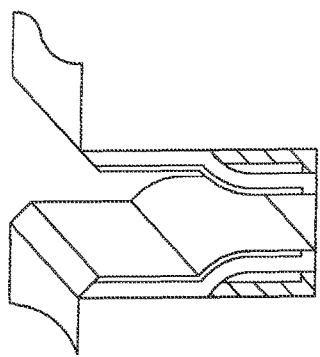
Figure 17:
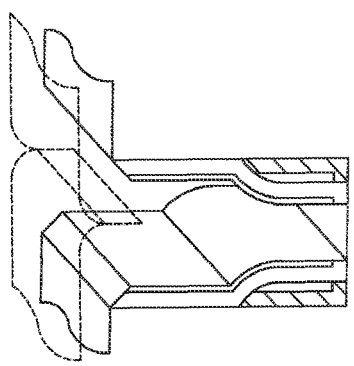
Figure 18:
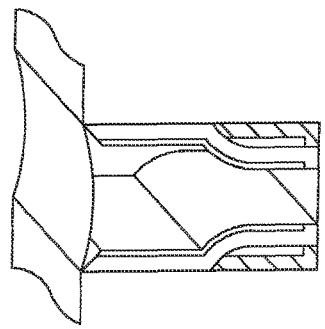
Figure 19:
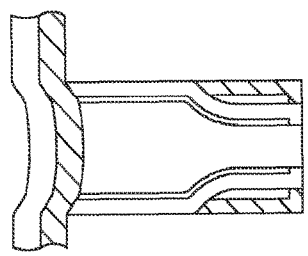
Figure 20:
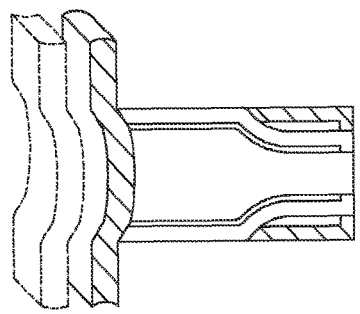
Figure 21:
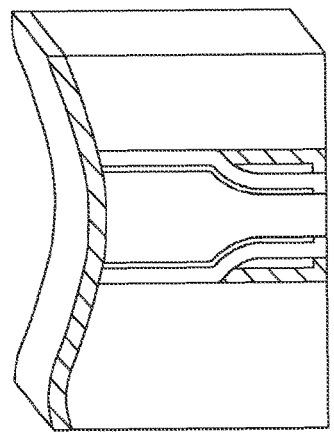
Figure 22:
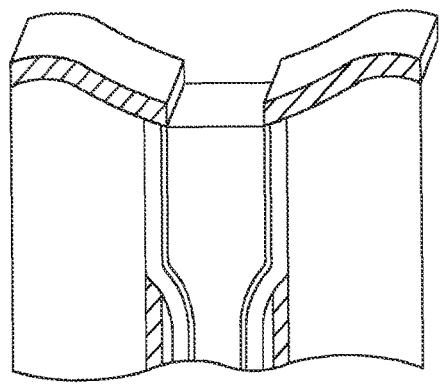

An anisotropic etch of the GST next is conducted to yield the structure shown in FIG. 16, following which SiO₂ is filled in the trench, as illustrated in FIG. 17. Next, chemical mechanical planarization (CMP) is carried out to remove excess SiO₂, yielding the structure as shown in FIG. 18. A top metal layer then is deposited, to form the structure shown in FIG. 19. A resist then is applied to the metal layer to define the self-alignment structure, as shown in FIG. 20, and the resist is developed to form the structure shown in FIG. 21. Next, metal is selectively removed to isolate the top electrode members as illustrated in FIG. 22.

Figure 23:
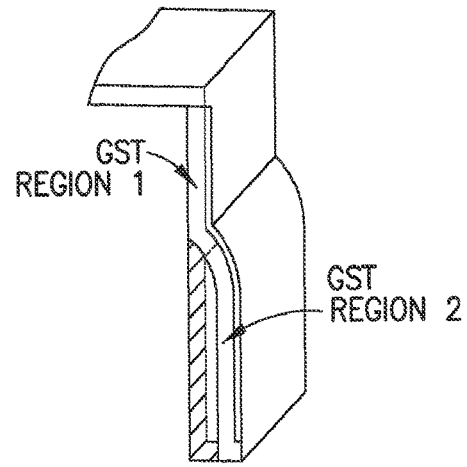

FIG. 23 shows the resulting structure of a double isolated PCM arrangement. The GST region 1 is identified in FIG. 23 as an upper portion of the GST film, and is the active region of the device. The GST region 2 is identified in FIG. 23 as a lower portion of the GST film, and is an inactive portion of the device, since electrical field at such lower portion is zero.

Figure 24:
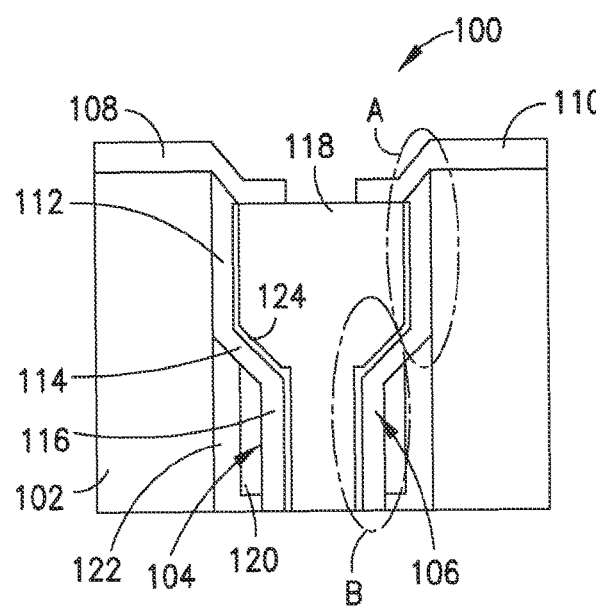
FIG. 24 is a schematic cross-sectional elevation view of a double self-aligned phase change memory device structure.

FIG. 24 is a schematic cross-sectional elevation view of a double self-aligned phase change memory device structure 100 of the present disclosure, according to one embodiment thereof. The device structure 100 comprises silicon dioxide (SiO₂) 102 bounding the double self-aligned phase change memory film members 104, 106, which may be formed of GST, GT, or other phase change material.

Each of the phase change memory film members 104, 106 comprises a bottom upwardly extending segment 116 that is coupled to a top upwardly extending segment 112 by an angled transitional segment 114 therebetween. The transitional segment 114 may have any suitable angle in relation to the top and bottom segments 112, 116 of the phase change memory film members, e.g., 45°. Layers 108, 110, 122 and 124 comprise titanium nitride (TiN), and layers 118 and 120 are layers of protective material for the TiN in the double self-aligned phase change memory device structure.

In the FIG. 24 structure, the upper phase change memory segment 112 in region "A" is active. The lower phase change memory segment 116 and transition segment 114 in region "B" are inactive, although the transition segment 114 effects some heat loss (heat dissipation) in the operation of the device structure.

Figure 25:
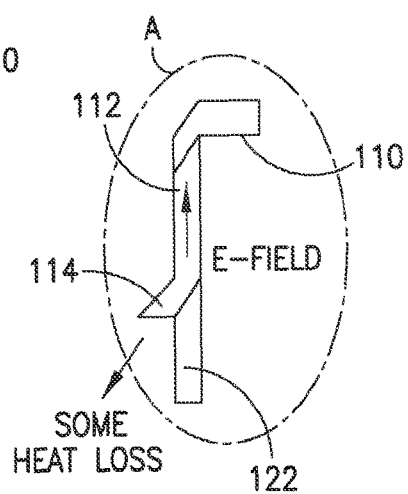
FIG. 25 is an enlarged portion of the phase change memory device structure of FIG. 24, showing the details of the phase change film member and associated TiN layer.

FIG. 25 is an enlarged portion of the phase change memory device structure 100 of FIG. 24, showing the details of the phase change film member and associated TiN layer. In the FIG. 25 drawing, the components of the structure are numbered correspondingly with respect to the reference numerals in FIG. 24.

In the FIG. 24 phase change memory device structure, the phase change memory material in transition segment 114 may be selectively removed, e.g., by over-etching during the anisotropic etching step (FIG. 16) for removal of the transition segment. By such modification, the upper segment 112 of phase change memory material is not electrically or thermally associated with the lower segment 116, and, as discussed, only the upper segment of phase change memory material constitutes the active phase change memory material in the structure.

Figure 26:
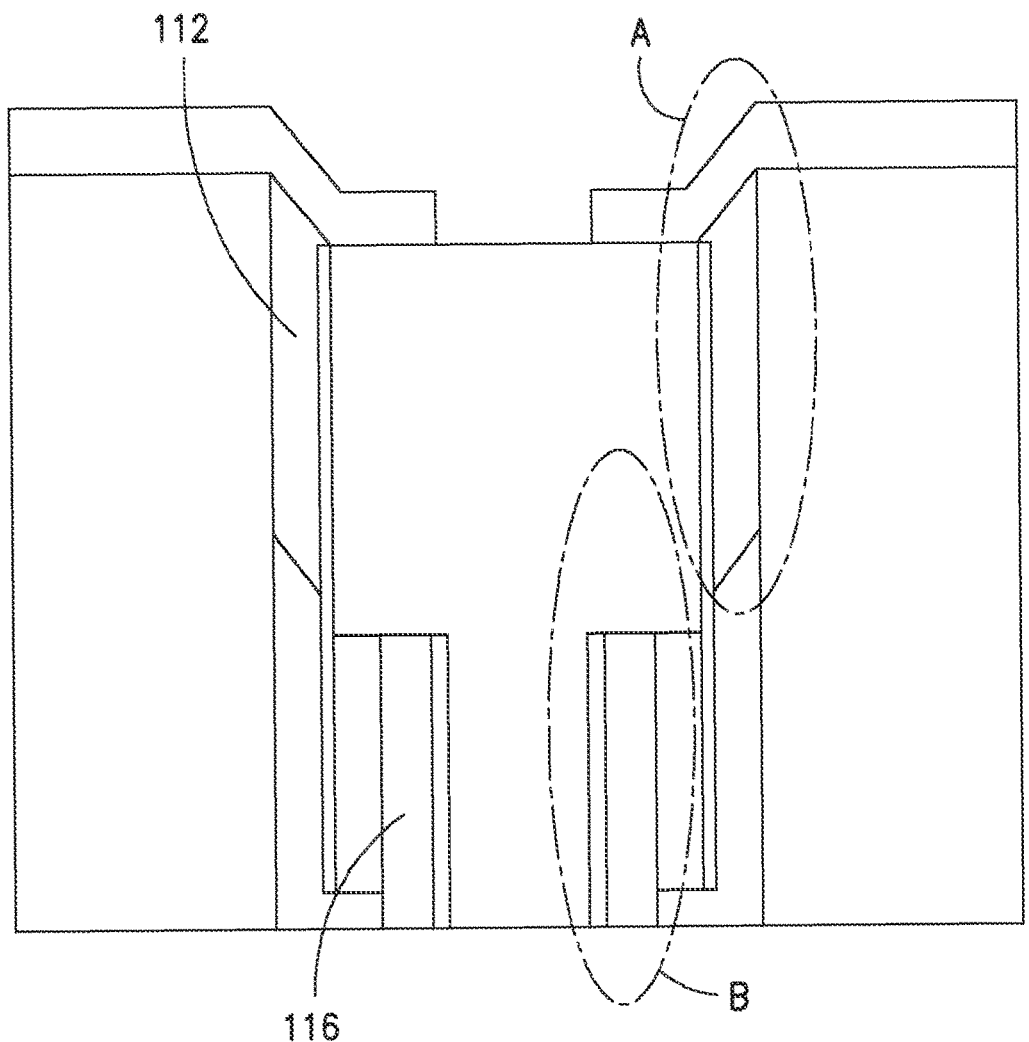
FIG. 26 is a schematic cross-sectional elevation view of a double self-aligned phase change memory device structure of a general type shown in FIG. 24, but wherein the transitional segment of the multi-segmented phase change memory film element has been removed by etch processing.

Such a modified phase change memory device structure is shown in FIG. 26, which is a schematic illustration of the double self-aligned phase change memory device structure corresponding to that shown in FIG. 24, but wherein the transition segment has been selectively removed so that the upper segment 112 of phase change memory material is physically isolated from the lower segment 116 of such material.

While the disclosure has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A double self-aligned phase change memory device structure, comprising spaced-apart facing phase change memory film members symmetrically arranged with respect to one another, each of the phase change memory film members at an upper portion thereof being in contact with a separate conductive element, and each of the phase change memory film members being in a range of from 5 nm to 25 nm in thickness.

2. The memory device structure of claim 1, wherein a protecting layer is disposed on facing surfaces of said phase change memory film members.

3. The memory device structure of claim 2, wherein the protecting layer extends downwardly from an upper end of each phase change memory film member over the facing surface thereof to a lower portion of the phase change memory film member.

4. The memory device structure of claim 3, further comprising a dielectric material between the phase change memory film members.

5. The memory device structure of claim 1, wherein each of the phase change memory film members has a thickness in a range of from 8 nm to 20 nm.

6. The memory device structure of claim 1, wherein each of the phase change memory film members has a thickness in a range of from 10 to 15 nm.

7. The memory device structure of claim 1, wherein each of the phase change memory film members has a thickness in a range of from 5 to 15 nm.

8. The memory device structure of claim 1, wherein each phase change memory film member has a height in a range of from 20 to 80 nm.

9. The memory device structure of claim 1, wherein each phase change memory film member has a height in a range of from 30 to 75 nm.

10. The memory device structure of claim 1, wherein each of the phase change memory film members comprises a chalcogenide.

11. The memory device structure of claim 1, wherein each of the phase change memory film members comprises a germanium-antimony-telluride alloy.

12. The memory device structure of claim 1, wherein each of the phase change memory film members comprises a germanium telluride alloy.

13. The memory device structure of claim 1, wherein the phase change memory film members are arranged in a confined cell arrangement comprising a cross-spacer structure wherein the phase change memory film members are reposed on titanium nitride members.

14. The memory device structure of claim 13, wherein a contact area of each phase change memory film member and the titanium nitride member on which it is reposed is in a range of from 50 to 150 $nm^2$.

15. The memory device structure of claim 13, wherein a contact area of each phase change memory film member and the titanium nitride member on which it is reposed is in a range of from 80 to 120 $nm^2$.

16. A double self-aligned phase change memory device structure, comprising spaced-apart facing phase change memory film members symmetrically arranged with respect to one another, each of the phase change memory film members at an upper portion thereof being in contact with a separate conductive element, and each of the phase change memory film members being in a range of from 5 nm to 25 nm in thickness, wherein each phase change memory film member comprises an upper planar segment, an intermediate angular transition segment, and a lower planar segment, arranged so that the upper planar segment and lower planar segment of each phase change memory film member are generally parallel to one another and to respective upper planar and lower planar segments of the other phase change memory film member facing it, wherein spacing distance between upper planar segments of the respective phase change memory film members is greater than spacing distance between lower planar segments of the respective phase change memory film members.

17. The memory device structure of claim 16, wherein the intermediate angular transition segment is generally planar.

18. A double self-aligned phase change memory device structure, comprising spaced-apart facing phase change memory film members symmetrically arranged with respect to one another, each of the phase change memory film members at an upper portion thereof being in contact with a separate conductive element, and each of the phase change memory film members being in a range of from 5 nm to 25 nm in thickness, wherein each phase change memory film member comprises an upper planar segment and a lower planar segment, elevationally spaced apart from one another, and arranged so that the upper planar segment and lower planar segment of each phase change memory material film member are generally parallel to one another and to respective upper planar and lower planar segments of the other phase change memory material film member facing it, wherein spacing distance between upper planar segments of the respective phase change memory material film members is greater than spacing distance between lower planar segments of the respective phase change memory film members.

19. A method of forming a double self-aligned memory device structure of claim 1, comprising:
 depositing a phase change material to form spaced-apart facing phase change memory film members symmetrically arranged with respect to one another, wherein each of the phase change memory film members is in a range of from 5 nm to 25 nm in thickness; and
 forming conductive elements so that each of the phase change memory film members at an upper portion thereof is in contact with a separate conductive element.

20. The method of claim 19, wherein the spaced-apart facing phase change memory film members are formed so that they are physically isolated from one another in the memory device structure.

* * * * *